(12) United States Patent
Chiang et al.

(10) Patent No.: US 8,124,488 B2
(45) Date of Patent: Feb. 28, 2012

(54) METHOD OF FABRICATING MEMORY

(75) Inventors: Lu-Ping Chiang, Hsinchu (TW); Hsiu-Han Liao, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 73 days.

(21) Appl. No.: 12/705,297

(22) Filed: Feb. 12, 2010

(65) Prior Publication Data

US 2011/0201170 A1 Aug. 18, 2011

(51) Int. Cl.
*H01L 21/336* (2006.01)

(52) U.S. Cl. .................................................. 438/303

(58) Field of Classification Search .............. 468/303, 468/230, 233; 438/303, 230, 233
See application file for complete search history.

(56) References Cited

U.S. PATENT DOCUMENTS

| | | | | |
|---|---|---|---|---|
| 6,455,362 B1 * | 9/2002 | Tran et al. | ............... | 438/194 |
| 6,509,235 B2 * | 1/2003 | Chien et al. | ............... | 438/275 |
| 6,960,512 B2 * | 11/2005 | Cheng et al. | ............... | 438/305 |
| 7,229,876 B2 * | 6/2007 | Chang et al. | ............... | 438/238 |
| 2002/0098704 A1 * | 7/2002 | Chien et al. | ............... | 438/694 |

* cited by examiner

*Primary Examiner* — Kevin M Picardat
*Assistant Examiner* — Neil Prasad
(74) *Attorney, Agent, or Firm* — J.C. Patents

(57) ABSTRACT

A method of fabricating a memory is provided. A substrate comprising a memory region and a periphery region is provided. A plurality of gates is formed on the substrate and a first spacer is formed on a sidewall of each gate, where a plurality of openings is formed between the gates in the memory region. A first material layer formed on the substrate in the memory region covers the gates in the memory region and fills the openings. A process is performed to the periphery region. The first material layer is partially removed to form a first pattern in each opening respectively. A second material layer formed on the substrate covers the memory region and the periphery region to expose the first patterns. The first patterns are removed to form a plurality of contact openings in the second material layer. The contact plugs are formed in the contact openings.

14 Claims, 6 Drawing Sheets

METHOD OF FABRICATING MEMORY

BACKGROUND OF THE INVENTION

1. Field of the Invention

The invention relates to a method of fabricating a memory.

2. Description of Related Art

In general, the fabrication of self-aligned contact (SAC) openings is applied to overcome the increasingly shrinking line widths of memory and to avoid misalignment of the contact openings. In the fabrication of SAC openings, the thickness of the spacers on the sidewalls of the gates affects the size of the contact openings formed between the gates. However, since the memory device includes the memory region and the periphery region, and components such as gates in the memory region and the periphery region have different requirements for the thickness of the spacers, the fabrication becomes more complicated. Generally, a first set of spacers is formed simultaneously on each sidewall of the gates in the memory region and the periphery region. Thereafter, in order to form the source and drain region in the periphery region, a second set of spacers is usually formed on the first set of spacers of each gate in the periphery region. For the convenience of fabrication, the material of the second set of spacers is simultaneously filled into the openings between the gates in the memory region. After the source and drain region is formed in the substrate in the periphery region, the material of the second set of spacers in the periphery region and the material of the second set of spacers between the gates in the memory region are removed at the same time.

However, as the openings between the gates in the memory region have a high aspect ratio, it is difficult to remove the material of the second set of spacers between the gates completely. Moreover, the first set of spacers in the memory region may be damaged during the removal. Therefore, the first set of spacers cannot provide superior electrical insulation to the gates, and the size of the contact openings subsequently formed by adopting the first set of spacers is also affected.

SUMMARY OF THE INVENTION

The invention is directed to a method of fabricating a memory, such that the fabrication is simplified and the memory obtains superior device characteristics.

The invention is directed to a method of fabricating a memory. A substrate including a memory region and a periphery region is provided. A plurality of gates is formed on the substrate and a first spacer is formed on a sidewall of each gate respectively. A plurality of openings is disposed between the gates in the memory region. A first material layer is formed on the substrate in the memory region. The first material layer covers the gates in the memory region and fills the openings. A process is performed to the periphery region. The first material layer is partially removed to form a first pattern in each opening. A second material layer is formed on the substrate. The second material layer covers the periphery region and the memory region and exposes the first patterns. The first patterns are removed to form a plurality of contact openings in the second material layer. A contact plug is formed in each contact opening.

According to an embodiment of the invention, the process includes the following. A second spacer is formed on the first spacer of each gate in the periphery region. The second spacers are used as a mask to form a source and drain region at respective sides of the gates in the periphery region. The second spacers of the gates are thereafter removed.

According to an embodiment of the invention, the step of partially removing the first material layer includes the following. A patterned mask layer is formed on the first material layer. The patterned mask layer is adopted as a mask to partially remove the first material layer to expose tops of the gates in the memory region. The patterned mask layer is then removed.

In light of the foregoing, in the method of fabricating the memory in the invention, the material layer is first used to cover the components in the memory region. Thus, when deposition and etching are performed to the periphery region, the components in the memory region are not damaged, so that the spacers on the sidewalls of the gates in the memory region can maintain intact structures. Hence, the spacers are capable of providing superior electrical insulation to the gates. In addition, the SAC openings can be formed between two adjacent spacers for the memory to have superior device characteristics.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
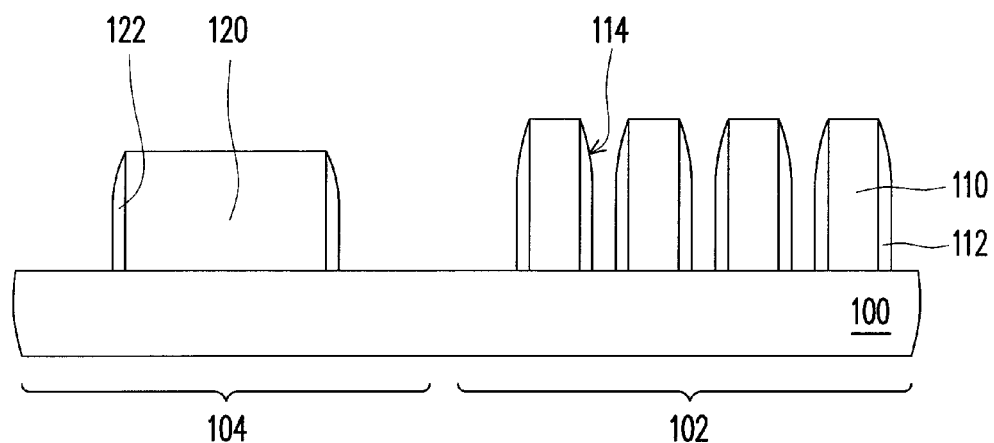
FIGS. 1A through 1I are schematic cross-sectional diagrams showing a flowchart of a method of fabricating a memory according to an embodiment of the invention.
Figure 1B:
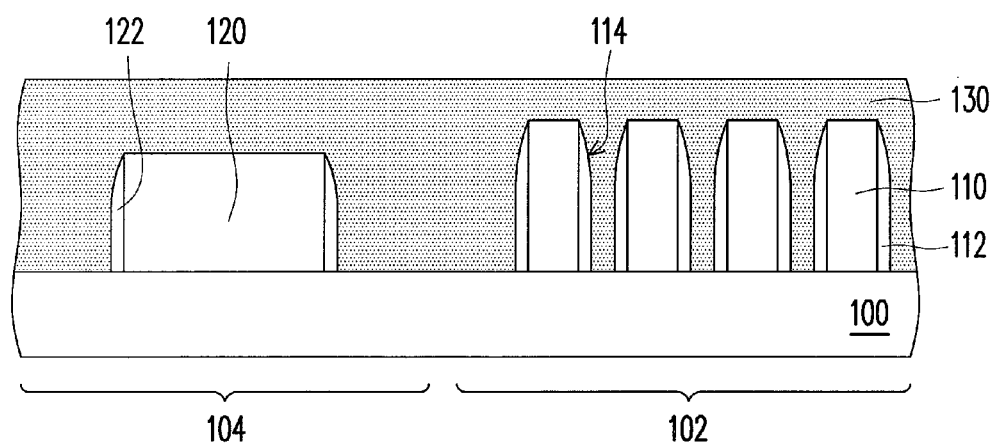
Figure 1C:
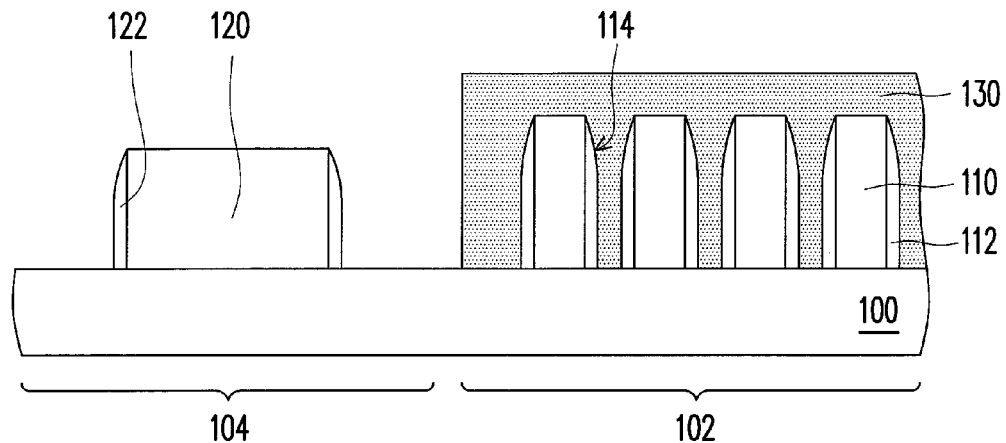
Figure 1D:
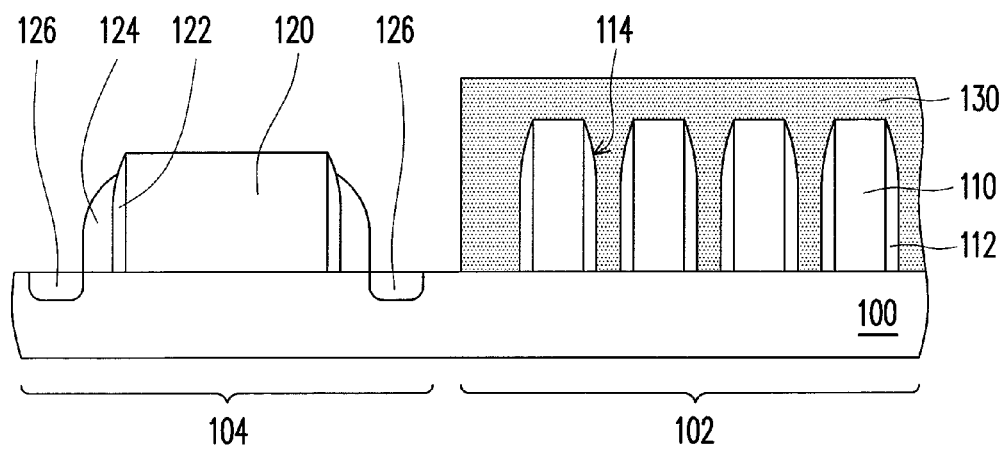
Figure 1E:
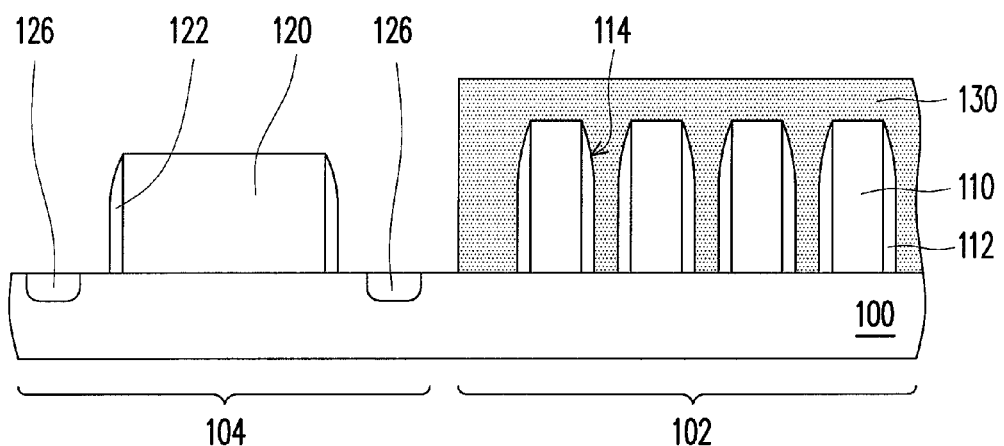
Figure 1F:
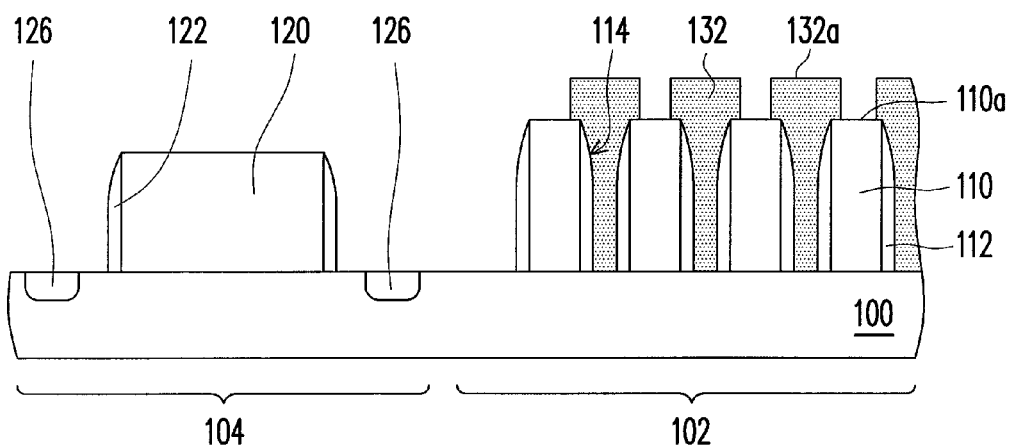

FIGS. 1A through 1I are schematic cross-sectional diagrams showing a flowchart of a method of fabricating a memory according to an embodiment of the invention. FIGS. 2A and 2B are top view diagrams of the memory region in FIG. 1A and 1F respectively, wherein FIG. 1A and 1F are cross-sectional diagrams of FIGS. 2A and 2B along the cutting line A-A', and in FIGS. 2A and 2B, the illustration of the spacers in the memory region is omitted.

Referring concurrently to FIG. 1A and 2A, a substrate 100 including a memory region 102 and a periphery region 104 is provided. A plurality of gates 110, 120 is formed on the substrate 100 and first spacers 112, 122 are formed on sidewalls of the gates 110, 120 respectively. A plurality of openings 114 is disposed between the gates 110 in the memory region 102. The substrate 100, for example, is a semiconductor substrate such as an N-type or a P-type silicon substrate, a group III-V semiconductor substrate, and the like. The gates 110, 120 are made of doped polysilicon, for instance. The first spacers 112, 122 are made of silicon nitride, for example. In this exemplary embodiment, as shown in FIG. 2A, the gates 110 disposed in the memory region 102 have strip shape and substantially parallel to each other, which is not limited in this invention. Namely, in other exemplary embodiments, the gates 110 can have other shapes and configurations.

Referring FIG. 1B, a first material layer 130 is formed on the substrate 100. The first material layer 130 covers the memory region 102 and the periphery region 104 and fills the openings 114. The first material layer 130 is made of, for example, polysilicon, and formed by a CVD process, for example. Thereafter, the first material layer 130 is planarized, for example, so that the first material layer 130 has a planar surface. The planarization process is, for example, a chemical mechanical polishing (CMP) process.

It should be noted that since thinner first spacers 112, 122 are adopted, the first material layer 130 is capable of filling the openings 114 with superior gap-filling ability.

Referring to FIG. 1C, the first material layer 130 covering the periphery region 104 is removed to expose the periphery region 104. The first material layer 130, for instance, is removed by using a reactive ion etching (RIE) process.

Referring to FIG. 1D, a second spacer 124 is formed on each first spacer 122 of the gate 120 in the periphery region 104. The second spacers 124 are formed as follows. Firstly, a spacer material layer (not shown) is formed on the substrate 100 by using a CVD process. Next, the spacer material layer is partially removed by using an anisotropic etching process, so as to form a spacer on each first spacer 122. Here, the second spacers 124 are made of, for instance, silicon nitride, and the spacer material layer is partially removed by using the RIE process to form the second spacers 124. Thereafter, a source and drain region 126 is formed at respective sides of the gate 120 in the periphery region 104 by performing an implantation process, where the second spacers 124 are adopted as a mask, for example.

As shown in FIG. 1E, the second spacers 124 are then removed. The second spacers 124 are removed by adopting a dry etching process or a wet etching process, for instance. Notably, although in the present embodiment, the method of fabricating the memory includes performing the step of removing the second spacers 124 as shown in FIG. 1E, the step of removing the second spacers 124 is actually optional. In other words, in another embodiment, the second spacers are not removed.

It should be noted that in this step, the first material layer 130 covers the memory region 102. Thus, the gates 110 and the first spacers 112 in the memory region 102 are protected by the first material layer 130. That is, in the conventional technique, the spacer material used to form the second spacers is filled into the openings between the gates in the memory region while the second spacers are formed, and the spacer material layer is removed from the openings while the second spacers are removed. However, in the present embodiment, the gates 110 or the first spacers 112 in the memory region 102 are not damaged in the formation or removal process (including deposition or etching) of the second spacers 124, such that the first spacers 112 in the memory region 102 maintain intact structures.

In the invention, the first material layer is suitable for protecting the memory region from being damaged by any processes performed in the periphery region.

Referring concurrently to FIG. 1F and 2B, the first material layer 130 is partially removed to form a first pattern 132 in each opening 114. In details, in this step, a patterned mask layer (not shown) is formed on the first material layer 130 (referring to FIG. 1D), for example. Next, the first material layer 130 is partially removed by adopting the patterned mask layer as a mask, so as to form the first patterns 132 in the openings 114 and expose a top 110a of each gate 110 in the memory region 102. Herein, a top 132*5a* of each first pattern 132 is higher than the top 110a of each gate 110, for instance. The patterned mask layer is then removed. The first material layer 130 is partially removed by using the RIE process, for example. Particularly, in this exemplary embodiment, as shown in FIG. 2B, a portion of the first material layer 130 is patterned to a plurality of first patterns 132 with island shape, and another portion of the first material layer 130 is patterned to a plurality of first patterns 132 with strip shape. In this exemplary embodiment, the plurality of first patterns 132 with island shape is arranged in one of the openings 114, and the plurality of first patterns 132 with strip shape is respectively disposed in one of the openings 114, for example. However, in other exemplary embodiments, the first patterns 132 can have other shapes and configurations, and the present invention is not limited thereto.

Figure 1G:
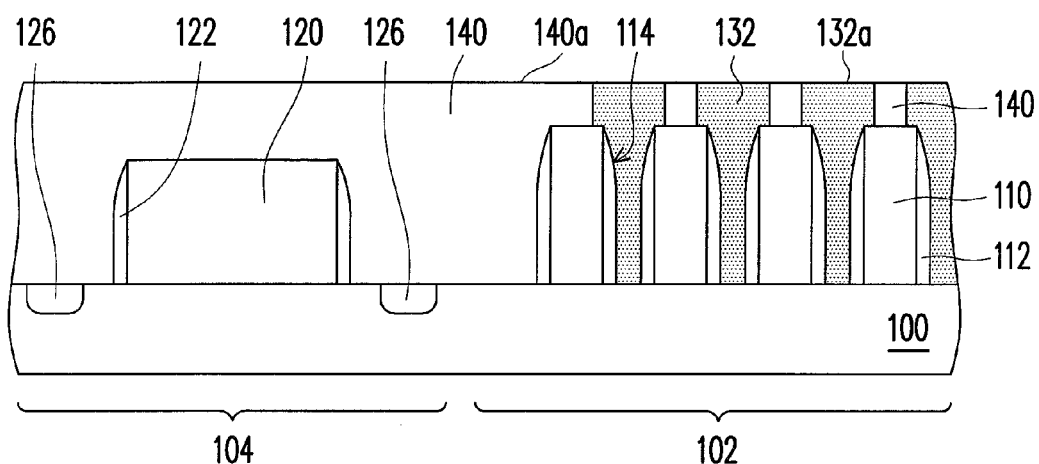
Figure 2A:
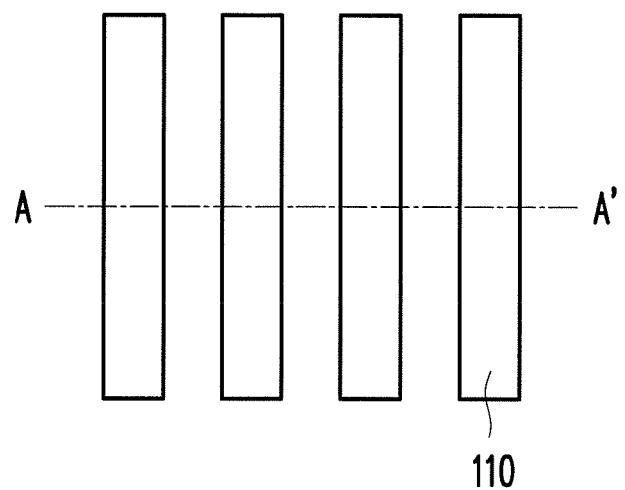
FIGS. 2A and 2B are top view diagrams of the memory region in FIG. 1A and 1F, respectively.
Figure 2B:
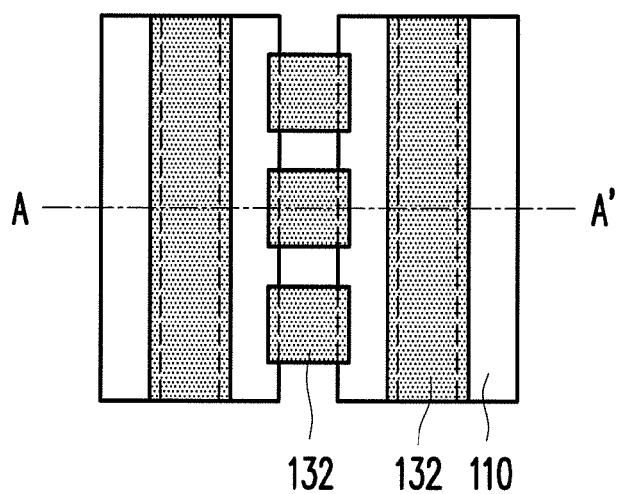

Referring to FIG. 1G, a second material layer 140 is formed on the substrate 100 to cover the periphery region 104 and the memory region 102. The second material layer 140 is made of, for example, borophosphosilicate glass (BPSG) or other suitable dielectric materials, and the second material layer 140 is formed by, for example, the CVD process. The second material layer 140 is then planarized, such that a top 140a of the second material layer 140 and the tops 132a of the first patterns 132 are even and substantially located on the same plane to expose the first patterns 132. The planarization is, for example, a chemical mechanical polishing process, where the tops 132a of the first patterns 132 are utilized as polishing endpoint.

Figure 1H:
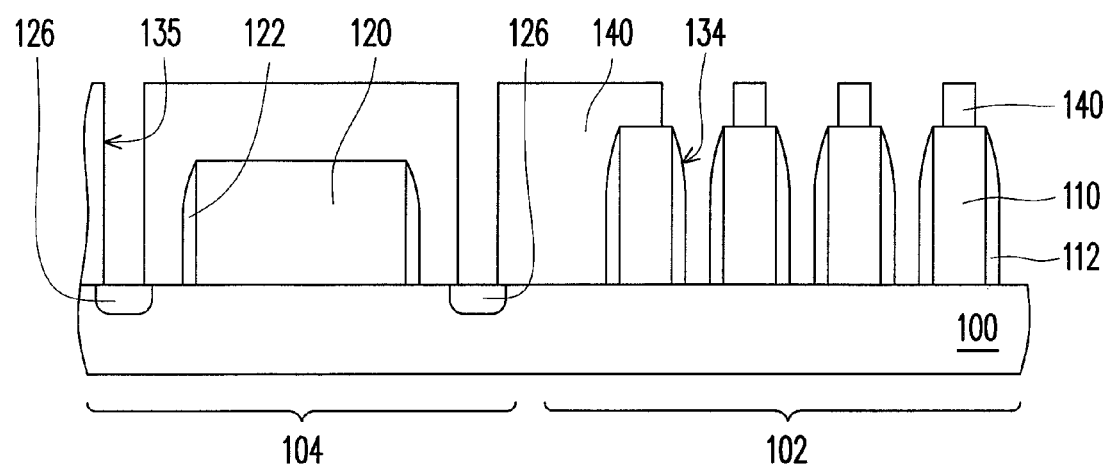

Referring to FIG. 1H, each first pattern 132 between the first spacers 112 is removed to form a contact opening 134. The first pattern 132 is removed by adopting the dry etching process or the wet etching process, for instance. The second material layer 140 in the periphery region 104 is removed so as to form contact openings 135 in the periphery region 104. Here, the contact openings 135 exposes the source and drain region 126. The second material layer 140 is removed by performing the dry etching process or the wet etching process, for instance.

Figure 1I:
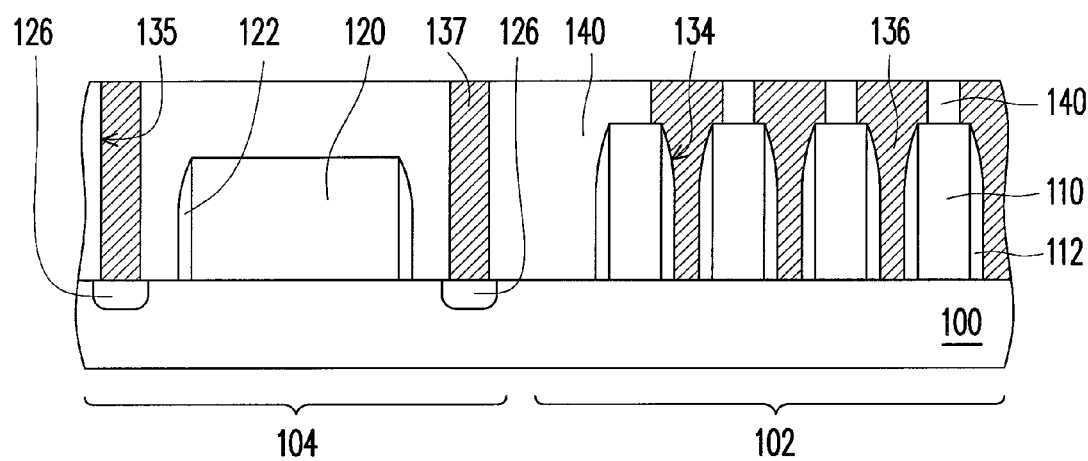

Referring to FIG. 1I, a conductive material layer is filled into the contact openings 134, 135 so as to form a contact plug 136 between two adjacent first spacers 112 and a contact plug 137 in the periphery region 104. The contact plugs 136, 137 are made of, for example, tungsten, copper, aluminum, or other suitable metals.

It should be noted that in the present embodiment, the locations for forming the contact openings 134 are first defined using the first patterns 132. Therefore, after the second material layer 140 is formed and the first pattern 132 is removed, the contact openings 134 are formed between the first spacers 112. In addition, since the first spacers 112 in the memory region 102 are covered by the first material layer 130, the first spacers 112 are not affected by the processes (i.e. the formation and removal of the second spacers 124) performed in the periphery region 104, so that superior electrical insulation is provided to the gates 110. Moreover, the contact plugs 136 are formed between the first spacers 112.

In summary, in the method of fabricating the memory in the invention, the material layer is used to cover the components in the memory region. Thus, when deposition and etching processes are performed to the periphery region, the components in the memory region are not damaged, so that the spacers on the sidewalls of the gates in the memory region can maintain intact structures. Hence, the spacers are capable of providing superior electrical insulation to the gates. The SAC openings can be formed between two adjacent spacers for the memory to have superior device characteristics.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a memory, comprising:
providing a substrate comprising a memory region and a periphery region, a plurality of first gates formed on the substrate in the memory region, a plurality of second gates formed on the substrate in the periphery region, and a first spacer formed on a sidewall of each of the first gates and the second gates, wherein a plurality of openings is disposed between the first gates in the memory region;
forming a first material layer on the substrate in the memory region, the first material layer covering the first gates in the memory region and filling the openings;
performing a process to the periphery region;
partially removing the first material layer to form a first pattern in each of the openings;
forming a second material layer on the substrate, the second material layer covering the periphery region and the memory region and exposing tops of the first patterns;
removing the first patterns to form a plurality of contact openings in the second material layer; and
forming a contact plug in each of the contact openings.

2. The method of fabricating the memory as claimed in claim 1, wherein the process comprises:
forming a second spacer on the first spacer of each of the second gates in the periphery region;
forming a source and drain region at respective sides of each of the second gates in the periphery region by adopting the second spacers as a mask; and
removing the second spacer.

3. The method of fabricating the memory as claimed in claim 2, wherein the second spacers are formed by using a reactive ion etching process.

4. The method of fabricating the memory as claimed in claim 2, wherein a material of the second spacers comprises silicon nitride.

5. The method of fabricating the memory as claimed in claim 1, wherein the first material layer comprises polysilicon.

6. The method of fabricating the memory as claimed in claim 1, wherein the first material layer is formed by performing a chemical vapor deposition process.

7. The method of fabricating the memory as claimed in claim 1, wherein a top of each of the first patterns is higher than a top of each of the first gates in the memory region.

8. The method of fabricating the memory as claimed in claim 1, wherein the step of partially removing the first material layer comprises:
forming a patterned mask layer on the first material layer;
partially removing the first material layer by using the patterned mask layer as a mask to expose the tops of the first gates in the memory region; and
removing the patterned mask layer.

9. The method of fabricating the memory as claimed in claim 8, wherein the first material layer is partially removed by using a reactive ion etching process.

10. The method of fabricating the memory as claimed in claim 1, wherein the second material layer comprises borophosphosilicate glass.

11. The method of fabricating the memory as claimed in claim 1, wherein the second material layer is formed by performing a chemical vapor deposition process.

12. The method of fabricating the memory as claimed in claim 1, wherein a top of the second material layer and a top of the first pattern are substantially on a same plane.

13. The method of fabricating the memory as claimed in claim 1, wherein the first patterns are removed by adopting a dry etching process or a wet etching process.

14. The method of fabricating the memory as claimed in claim 1, wherein a portion of the first patterns have an island shape and another portion of the first patterns have a stripe shape.

* * * * *